US010121932B1

(12) United States Patent
Torres, Jr. et al.

(10) Patent No.: US 10,121,932 B1
(45) Date of Patent: Nov. 6, 2018

(54) TUNABLE GRAPHENE LIGHT-EMITTING DEVICE

(71) Applicant: THE UNITED STATES OF AMERICA AS REPRESENTED BY THE SECRETARY OF THE NAVY, Washington, DC (US)

(72) Inventors: Carlos M. Torres, Jr., San Diego, CA (US); James R. Adleman, San Diego, CA (US); Ryan P. Lu, San Diego, CA (US); Kang L. Wang, Santa Monica, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 0 days.

(21) Appl. No.: 15/827,556

(22) Filed: Nov. 30, 2017

Related U.S. Application Data

(60) Provisional application No. 62/428,113, filed on Nov. 30, 2016.

(51) Int. Cl.
*H01L 33/00* (2010.01)
*H01L 33/34* (2010.01)
*H05B 33/08* (2006.01)

(52) U.S. Cl.
CPC .......... *H01L 33/0041* (2013.01); *H01L 33/34* (2013.01); *H05B 33/0842* (2013.01)

(58) Field of Classification Search
None
See application file for complete search history.

(56) References Cited

U.S. PATENT DOCUMENTS

| 4,720,642 A * | 1/1988 | Marks | B82Y 10/00 257/E33.044 |
| 6,921,924 B2 * | 7/2005 | Tsai | H01L 33/24 257/103 |

(Continued)

OTHER PUBLICATIONS

Li, T., et al., "Femtosecond Population Inversion and Stimulated Emission of Dense Dirac Fermions in Graphene", Physical Review Letters, 108, 167401 (2012).

(Continued)

*Primary Examiner* — Crystal L Hammond
(74) *Attorney, Agent, or Firm* — SPAWAR Systems Center Pacific; Kyle Eppele; Ryan J. Friedl

(57) ABSTRACT

A device includes a substrate with a tunnel barrier disposed on active region defined on the substrate, a monolayer of graphene disposed on the tunnel barrier, a dielectric material disposed on the graphene, and an electrode disposed over a region of the dielectric material. A first voltage is applied across the electrode and the graphene to adjust a Fermi level within the graphene to a Fermi level position within the valence band of the graphene based upon a predetermined emission wavelength. A current is injected into the graphene's conduction band to cause the graphene to emit a broadband hot electron luminescence (HEL) spectrum of photons peaked at the predetermined emission wavelength. The device may be configured as a vertical-tunneling light-emitting hot-electron transistor. The broadband HEL photon emission spectrum emanating from the graphene may be voltage-tunable within the electromagnetic spectrum from UV to THz.

24 Claims, 9 Drawing Sheets

(56) References Cited

U.S. PATENT DOCUMENTS

| | | | | |
|---|---|---|---|---|
| 6,958,497 | B2* | 10/2005 | Emerson | H01L 21/0237 257/103 |
| 7,148,519 | B2* | 12/2006 | Wu | H01L 21/0237 257/97 |
| 7,193,246 | B1* | 3/2007 | Tanizawa | B82Y 20/00 257/101 |
| 8,426,887 | B2* | 4/2013 | Son | H01L 33/24 257/103 |
| 8,554,022 | B1* | 10/2013 | Hochberg | H01L 29/66977 257/21 |
| 8,592,841 | B2* | 11/2013 | Nakamura | H01L 33/32 257/96 |
| 9,240,533 | B2* | 1/2016 | Lee | H01L 33/58 |
| 9,281,439 | B2* | 3/2016 | Niwa | H01L 33/32 |
| 9,312,428 | B2* | 4/2016 | Shatalov | H01L 33/007 |
| 9,331,244 | B2* | 5/2016 | Shatalov | H01L 33/32 |
| 9,331,246 | B2* | 5/2016 | Kneissl | H01L 33/46 |
| 9,356,192 | B2* | 5/2016 | Pernot | H01L 33/16 |
| 9,362,488 | B2* | 6/2016 | Bowen | H01F 10/005 |
| 9,385,271 | B2* | 7/2016 | Shur | H01L 33/06 |
| 9,397,269 | B2* | 7/2016 | Chae | H01L 33/38 |
| 9,401,452 | B2* | 7/2016 | Northrup | H01S 5/0421 |
| 9,401,456 | B2* | 7/2016 | Lee | H01L 33/38 |
| 9,412,901 | B2* | 8/2016 | Shur | H01L 33/06 |
| 9,412,902 | B2* | 8/2016 | Shatalov | H01L 33/0025 |
| 9,412,922 | B2* | 8/2016 | Jang | H01L 27/156 |
| 9,437,774 | B2* | 9/2016 | Gaska | H01L 33/32 |
| 9,437,775 | B2* | 9/2016 | Takeuchi | H01S 5/3202 |
| 9,450,157 | B2* | 9/2016 | Yamada | H01L 33/56 |
| 9,496,455 | B2* | 11/2016 | Park | H01L 33/06 |
| 9,543,537 | B2* | 1/2017 | Steirer | H01L 51/4253 |
| 2002/0149033 | A1* | 10/2002 | Wojtowicz | H01L 29/155 257/198 |
| 2008/0191196 | A1* | 8/2008 | Lu | B82Y 10/00 257/27 |
| 2009/0194784 | A1* | 8/2009 | Kaji | H01L 33/16 257/103 |
| 2011/0089415 | A1* | 4/2011 | Han | H01L 21/02175 257/43 |
| 2011/0180778 | A1* | 7/2011 | Lin | H01L 33/04 257/13 |
| 2012/0273763 | A1* | 11/2012 | Banerjee | H01L 49/003 257/39 |
| 2012/0305075 | A1* | 12/2012 | Ford | H01L 31/03529 136/257 |
| 2013/0048939 | A1* | 2/2013 | Zhang | H01L 21/0242 257/13 |
| 2013/0146836 | A1* | 6/2013 | Kastalsky | H01L 51/0048 257/13 |
| 2014/0024159 | A1* | 1/2014 | Jain | H01L 33/0079 438/46 |
| 2014/0077161 | A1* | 3/2014 | Duan | B82Y 10/00 257/29 |
| 2015/0083206 | A1* | 3/2015 | Novoselov | B82Y 30/00 136/256 |
| 2017/0179314 | A1* | 6/2017 | Novoselov | B82Y 30/00 |
| 2017/0294629 | A1 | 10/2017 | Kim et al. | |
| 2018/0158913 | A1* | 6/2018 | Withers | H01L 29/267 |

OTHER PUBLICATIONS

Chen, Chi-Fan, et al., "Controlling inelastic light scattering quantum pathways in graphene", Nature, v. 471, pp. 617-620, 2011.

Beams, R. et. al., "Electroluminescence from graphene excited by electron tunneling", Nanotechnology, v. 25, IOP Publishing, 2014.

Beams, R. et al., "Graphene Luminescence from Tunneling Electrons", FiO/LS Technical Digest, OSA (2012).

Kong, B., et al., "Hot electron inelastic scattering and transmission across graphene surfaces", Journal of Applied Physics, 121, 235101 (2017).

Parzefall, M. et al., "Antenna-coupled Photon Emission from Hexagonal Boron Nitride Tunnel Junctions," Nature Nanotechnology, v. 10, pp. 1058-1063 (2015).

Chakraborty, C. et al., "Voltage-controlled Quantum Light from an Atomically Thin Semiconductor," Nature Nanotechnology, v. 10, pp. 507-511 (2015).

* cited by examiner

TUNABLE GRAPHENE LIGHT-EMITTING DEVICE

CROSS-REFERENCE TO RELATED APPLICATIONS

This application claims the benefit of U.S. Provisional Patent Application Ser. No. 62/428,113 filed Nov. 30, 2016, entitled "Voltage-Controlled Wavelength-Agile Graphene Broadband Infrared Light-Emitting Transistor", the content of which is fully incorporated by reference herein.

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103883.

BACKGROUND

There is a need for low-power and ultra-fast switching technologies. Optoelectronic switching is widely regarded to be one such enabling technology. Graphene has great potential for optoelectronic functionality since it supports tunable light absorption, broadband plasmonic phenomena, has the capability to allow for electrical switching at up to terahertz frequencies, and features broadband spontaneous and stimulated photon emission in the near-infrared. However, voltage-tunable wavelength-agile electrically-induced light emission is a key missing piece that would allow a graphene-based semiconductor optoelectronics platform for information processing operating in, for example, the commercially relevant infrared telecommunication bands of 1300 nm and 1550 nm. A graphene-based device capable of electrically-tunable hot electron luminescence (HEL) would constitute a major breakthrough in graphene-silicon optoelectronics.

DETAILED DESCRIPTION OF SOME EMBODIMENTS

Figure 1:
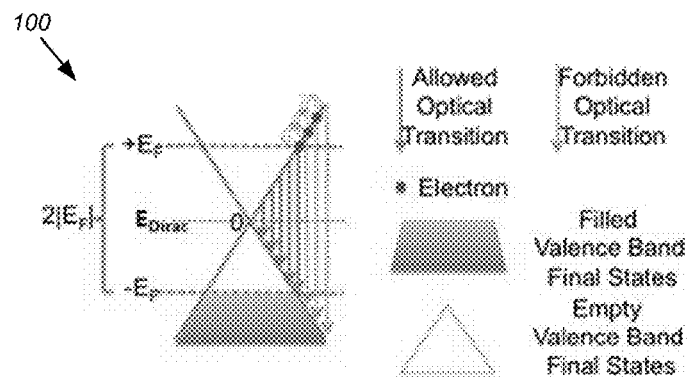
FIG. 1 shows a diagram illustrating the principle of operation for a device using hot electron luminescence in accordance with the disclosed embodiments.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise. Further, features/components of the embodiments disclosed herein having the same or similar names may be construed as having the same or similar characteristics.

The disclosed embodiments involve an atomic-scale optoelectronic incoherent light source with a broadband photon emission spectrum whose peak value can be dynamically (e.g. in-situ) tuned by the application of a top-gate voltage (e.g. a perpendicular electric field). The broadband hot electron luminescence (HEL) photonic spectrum features a full-width at half-maximum (FWHM) of around 200 nm and it features a peak at the onset of the HEL energy relaxation pathway at $\hbar\omega_{emit} \leq 2|E_F|$. The peak of the broadband HEL spectrum can be dynamically and continuously tuned via an applied voltage across the electromagnetic spectrum (e.g. UV to THz), as long as the Fermi level ($E_F$) lies within the vicinity of the Dirac points (K/K') in the Brillouin zone of graphene. This is because graphene features a linear energy dispersion relation with symmetric electron-hole bands that meet at the Dirac points (e.g. no bandgap). Devices may be configured to operate throughout the electromagnetic spectrum from the ultra-violet to terahertz (e.g. UV to THz). In some embodiments, devices may be configured to operate within portions of the spectrum, such as from the visible to short-wave infrared spectral range.

The embodiments of the devices disclosed herein operate via injection electroluminescence. The devices benefit from the band-gap less nature and linear energy dispersion relation of graphene in order to provide a highly wavelength tunable (e.g. wavelength agile) and broadband photon emission spectrum. The disclosed embodiments exploit hot electron luminescence as a non-negligible radiative recombination pathway whose onset of which can be induced by electrostatic gating in order to tune the graphene Fermi level. Some disclosed embodiments involve a device structured as a dual-gated transistor with a top-gate dielectric (including but not limited to HfO$_2$, Al$_2$O$_3$, ion-gel, ionic liquid, hexagonal boron nitride, a gel polymer electrolyte, or any material that features an "electric double layer" gating effect, etc. . . . ) and an ultra-thin tunneling barrier which may be comprised of materials including, but not limited, to SiO$_2$, hexagonal boron nitride, MgO, Gd$_2$O$_3$, bilayer tunnel barriers, vacuum (e.g. van der Waals gap), etc., sandwiching the graphene in between them.

Graphene is the cleanest, simplest, and unique solid-state material which can enable a "full-spectrum" (e.g. UV to THz) and "on-demand" source of incoherent photons due to its linear dispersion relation which renders possible an ultra-wideband of available optical inter-band transitions (e.g. absorption and emission of photons) near its six Dirac (e.g. K/K') cones in its Brillouin zone (e.g. Fourier/phase space). In the disclosed embodiments, monolayer graphene (e.g. a linearly dispersive Dirac material lacking an energy bandgap) is the active material and hence serves as the photon source. The disclosed embodiments achieve voltage-tunable hot electron luminescence (HEL) without any laser excitation. Instead, the embodiments operate by the quantum mechanical tunneling of hot electrons into the conduction band of highly p-doped graphene via applied voltage biases.

The disclosed embodiments provide the potential to enable CMOS-compatible, scalable, wavelength-tunable broadband light sources from a single atomic layer of graphene. The photon emission wavelength can be tuned from the visible to the far-infrared regions of the electromagnetic spectrum by applying a top-gate voltage across a suitable top-gate dielectric with a high enough dielectric strength to avoid dielectric breakdown. Devices such as those disclosed herein could serve as a low-optical power light source in combination with a vertically displaced graphene photodetector for applications such as optical signal routing, optical interconnect, and hybrid 2D material/ silicon photonics.

The disclosed embodiments operate based upon a concept that differs from the typical light-emitting diodes, in which p-n junction diodes serve as the active area of the device for light emission. The disclosed embodiments do not feature a p-n junction diode, but rather the light emission is possible by the physical phenomena of hot electron luminescence (e.g. the recombination of hot electrons with available empty valence band states in the graphene itself). This is a radiative recombination mechanism in graphene itself and depends upon the carrier density and kinetic energy of the injected hot electrons as well as the position of the Fermi level in the graphene valence band (e.g. p-doping the graphene to have many available empty valence band states for these hot electrons to recombine to).

FIG. 1 shows a diagram 100 illustrating the principle of operation for a device using hot electron luminescence in accordance with the disclosed embodiments. Once the hot electrons are injected into the graphene conduction band, they start to lose their kinetic energy via various energy relaxation pathways due to radiative or non-radiative mechanisms. The hot carrier distribution (e.g. described by an elevated effective temperature) can undergo intra-band scattering in the conduction band via electron-electron scattering (timescale of around 10 fs), the emission of optical phonons (timescale of around 100 fs), and eventually the emission of acoustic phonons until the distribution reaches thermal equilibrium with the graphene lattice temperature (timescale >1 ps). The peak value (e.g. onset) of broadband hot electron luminescence (e.g. peak/cutoff photon emission wavelength) occurs near twice the value of the Fermi level shift into the valence band of the graphene with respect to the Dirac point in the graphene (e.g. $\hbar \omega_{emit} \leq 2|E_F|$ threshold).

For hot electrons with energies higher than $2|E_F|$ (e.g. with respect to the Fermi level in the valence band) in the conduction band of graphene, there are no available empty valence band states for them to recombine to, hence, there is no light emission from the graphene. However, for hot electrons in the conduction band of graphene at energies below the $2|E_F|$ threshold, there are many available empty valence band states for them to recombine with, and hence light emission from graphene is possible. Thus, this voltage-tunable $2|E_F|=\hbar\omega$ threshold mimics the function of a "tunable optical band gap" in the sense that electrons in the conduction band of graphene can recombine with holes in the valence band of graphene itself (e.g. reminiscent to inter-band radiative recombination in materials with a direct energy bandgap).

Figure 2:
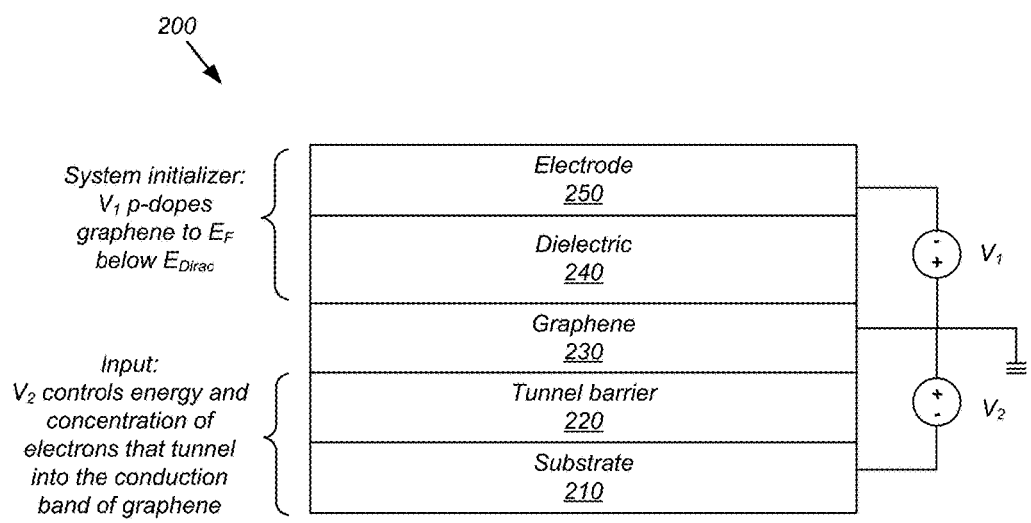
FIG. 2 shows a diagram illustrating an embodiment of a device and operational procedure in accordance with the disclosed embodiments.

FIG. 2 shows a diagram illustrating an embodiment of the active region of a device 200 and operational procedure in accordance with the disclosed embodiments. The active region of the device 200 includes a substrate 210, a tunnel barrier 220 disposed on the active regions of the substrate 210 after a thick field oxide was disposed on the substrate 210 to electrically isolate the various devices from each other, a monolayer of graphene 230 disposed over the tunnel barrier 220, a dielectric material 240 disposed over graphene 230, and an electrode 250 disposed over dielectric material 240. A first voltage source $V_1$ is connected to electrode 250 and the graphene 230, while a second voltage source $V_2$ is connected to substrate 210 and the graphene 230. The graphene 230 is grounded during the application of the first voltage $V_1$ and the second voltage $V_2$.

Substrate 210 comprises a material such as a metal, a semi-metal or a semiconductor that is capable of supplying a hot carrier distribution. As an example, in some embodiments the substrate comprises a compound semiconductor selected from one of elemental groups II-VI, III-V and IV. In some embodiments, substrate 210 comprises degenerately-doped n-type silicon. In some embodiments, substrate 210 may comprise graphene. In such embodiments, tunnel barrier 220 may comprise monolayer or multilayer hexagonal boron nitride for example, with graphene 230 being disposed thereon. In embodiments where the substrate comprises graphene, the graphene may be supported by a plastic-like base. Such a configuration of using graphene as a substrate adds flexibility, allowing device 200 to be used within clothing, visor/displays, wearable optoelectronics, etc.

As an example, tunnel barrier 220 comprises one of MgO, $SiO_2$, hexagonal boron nitride, $Gd_2O_3$, bilayer tunnel barriers, etc. In some embodiments, tunnel barrier 220 comprises a vacuum (e.g. van der Waals gap). However, a person having ordinary skill in the art will recognize that other materials may be used. As an example, tunnel barrier 220 may be disposed on an active region(s) of the substrate via a device isolation technique including, but not limited to, the LOCOS (LOCal Oxidation of Silicon) or STI (Shallow Trench Isolation) processes.

In some embodiments, graphene 230 comprises one layer of graphene. In some embodiments graphene 230 comprises more than one separate monolayers of graphene each featuring a band structure with linear energy dispersion relation near the Dirac (K/K') point. In such embodiments, the separate monolayers of graphene may be either contacting each other or separated by atomically-thin layered materials. As an example, the atomically-thin layered materials comprise one of hexagonal boron nitride and transition metal dichalcogenides.

In some embodiments, dielectric material 240 comprises a high-k dielectric material, with "high-k" referring to a material having a dielectric constant k greater than that of $SiO_2$, or greater than about 3.8. As an example, dielectric material 240 comprises one of $HfO_2$, $TiO_2$, $Al_2O_3$, and monolayer or multi-layer hexagonal boron nitride. In some embodiments dielectric material 240 comprises an ion-gel, while in other embodiments dielectric material 240 comprises an ionic liquid. In the embodiment where the dielectric material 240 comprises an ionic liquid, a probe may serve as the electrode 250, thus eliminating the need for the deposition of electrode 250.

In some embodiments, the first step of operation of device 200 involves applying a negative DC gate voltage bias to $V_1$ (e.g. the "system initializer" top-gate electrode), which initializes the graphene system by highly p-doping it (e.g. tuning its Fermi level $-E_F$ below graphene's Dirac charge-neutrality point). In some embodiments, a high-k dielectric may be used as the top-gate "graphene initializer" dielectric in order to induce as large a hole concentration in the graphene as possible. The second step involves applying a negative DC gate voltage bias to $V_2$ (e.g. the "hot electron injector" back-gate electrode in this embodiment) in order to inject a current (hot electrons) from the underlying degenerately n-doped silicon substrate through an ultra-thin tunneling barrier located in the active region of device 200. While in some embodiments the current injected is electrically induced, such as via a pulsed or DC voltage, in other embodiments the current may be photo-induced, such as via a femtosecond pulsed laser.

The disclosed embodiments may be made using variations of materials for the underlying substrate, dielectrics (e.g. back-gate tunneling barrier and top-gate dielectric) and the electrodes. Selecting the proper dielectric materials and their thicknesses can optimize the amount of bias voltage needed to emit a broadband HEL spectrum whose peak optical power lies at the onset of the HEL energy relaxation pathway (e.g. a-prior predetermined photon emission wavelength peaked at $\lambda_{emit} \geq 1.24/\hbar \omega_{emit}$ where $\hbar \omega_{emit} \leq 2|E_F|$). Additionally, the "effective" optical energy bandgap at zero bias (e.g. graphene Fermi level position within its valence band) may be modified by the intentional chemical doping of the graphene active area. Further, an analogous hot-hole device could also be constructed by implementing a highly p-doped substrate and reversing the polarity of the applied biases.

As an example, one embodiment of a device structure is configured to emit broadband near-infrared (NIR) light near the 1550 nm telecommunications band with peak intensity in the pico-watt regime. It should be noted that this optical intensity could be increased by several orders of magnitude with future optimization of the device structure, such as increasing the tunneling current density through an optimized tunneling barrier (e.g. but not limited to MgO, $Gd_2O_3$, hexagonal boron nitride, bilayer tunnel barriers, etc.). In addition, the disclosed device structure could allow for voltage-controlled tuning of the peak wavelength ($\lambda_{emit}$) of the broadband HEL spectrum. A graphene-based light-emitting transistor may allow for novel CMOS compatible scalable graphene optoelectronic devices and information processing platforms.

Figures 3A, 3B:
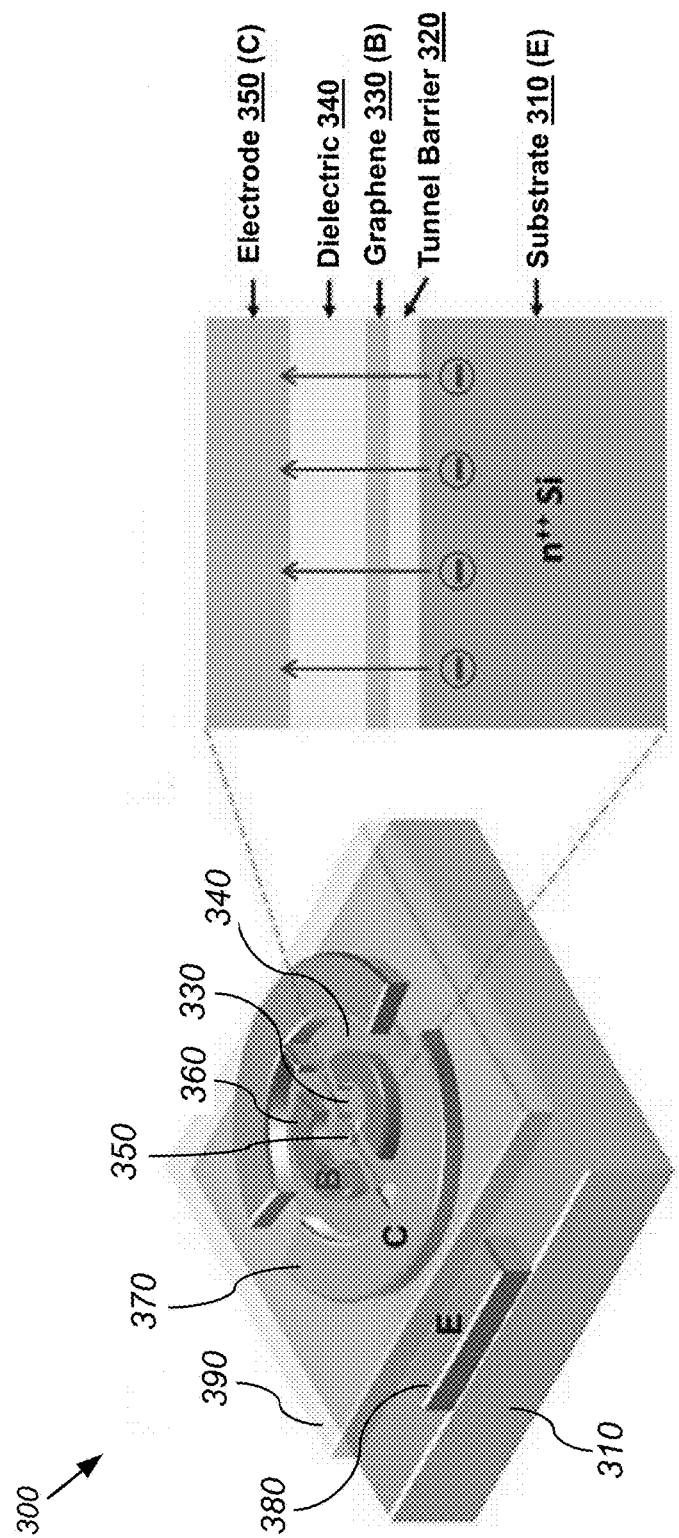
FIG. 3A shows an isometric view of an embodiment of a device in accordance with the disclosed embodiments.
FIG. 3B shows a cross-section view of the active region of the device shown in FIG. 3A.
Figure 3C:
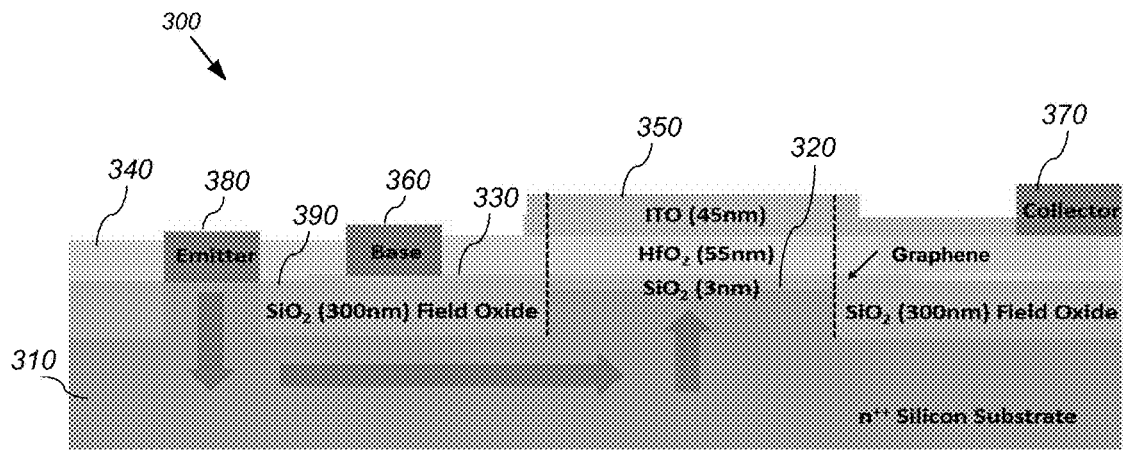
FIG. 3C shows a cross-section view of the device shown in FIG. 3A.

In some embodiments, the disclosed device may be configured as a hot-electron transistor with a single-layer of graphene as the active material (i.e. light emitting material) in the base region. Referring to FIGS. 3A-3C, FIG. 3A shows an isometric view of an embodiment of a device 300 having such a structure, FIG. 3B shows a cross-section view of the active region (e.g. heterostructure) of device 300, and FIG. 3C shows a cross-section view of device 300. It should be noted that the materials and thicknesses shown in FIG. 3C are for one particular embodiment of device 300 and the materials and their thicknesses can be altered as recognized by a person having ordinary skill in the art and still fall within the scope of the claimed invention. The field oxide ($SiO_2$) is grown during the device isolation step and serves to electrically isolate nearby devices from each other and to confine the injected hot electron current from substrate 310 into the active region of device 300. Its thickness is not limited to 300 nm as shown in FIG. 3C.

Device 300 includes a substrate 310, a tunnel barrier 320 (see FIG. 3B and FIG. 3C) in the active regions defined by a thick field oxide (e.g. implementing a device isolation method such as the LOCOS (LOCal Oxidation of Silicon) process (see FIG. 3C)) disposed on substrate 310, at least one monolayer of graphene 330 disposed over the tunnel barrier 320, a dielectric material 340 disposed over the monolayer of graphene 330, and an electrode 350 disposed over a portion of the dielectric material 340. Device 300 further includes a first electrical contact (base) 360 disposed over a portion of the monolayer of graphene 330 which lies outside of the active region of the device 300 (see FIG. 3C), a second electrical contact (collector) 370 disposed over a portion of the dielectric material 340 and is electrically connected to the optically transparent electrode 350 (see FIG. 3C) in the active region of the device 300, and a third electrical contact (emitter) 380 disposed over a portion of the substrate 310. The thick field oxide 390 (e.g. $SiO_2$) used for device isolation is disposed across the substrate 310 prior to the deposition of the tunnel barrier 320, via a device isolation method such as the LOCOS or STI (Shallow Trench Isolation) processes (see FIG. 3C).

A first voltage source $V_1$ is connected between first electrical contact 360 and second electrical contact 370. The first voltage source is configured to apply a first voltage to adjust a Fermi level within monolayer of graphene 330 to a predetermined Fermi level position within a valence band of monolayer of graphene 330 based upon a predetermined photon emission wavelength ($\lambda_{emit}$). A second voltage source $V_2$ is connected between first electrical contact 360 and third electrical contact 380. The second voltage source is configured to apply a second voltage to inject a current into a conduction band of the monolayer of graphene 330 to cause monolayer of graphene 330 to emit a broadband HEL spectrum whose peak optical power lies at the onset of the HEL energy relaxation pathway (e.g. a-prior predetermined photon emission wavelength peaked at $\lambda_{emit} \geq 1.24/\hbar\omega_{emit}$ where $\hbar\omega_{emit} \leq 2|E_F|$.

Figure 4:
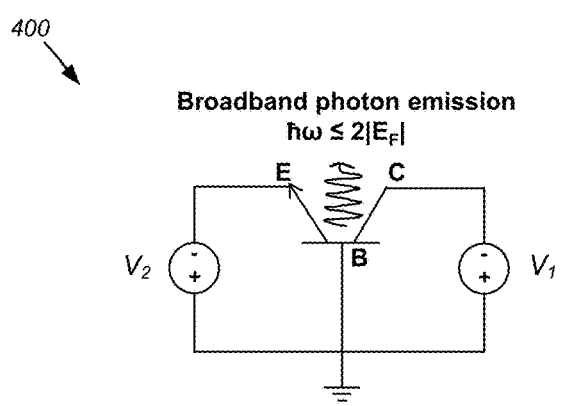
FIG. 4 shows a diagram illustrating a common-base configuration that may be used for biasing the vertical-tunneling light-emitting hot-electron graphene-base transistor devices in accordance with the disclosed embodiments.

FIG. 4 shows a diagram 400 illustrating a common-base configuration that may be used for electrically biasing light-emitting hot-electron transistor devices in accordance with the disclosed embodiments. Diagram 400 illustrates the connections of the first voltage source $V_1$ and the second voltage source $V_2$ in relation to the collector (C), base (B), and emitter (E) as shown in FIGS. 3A-3C, as well as the photon emission (optical signal) emanating from the properly voltage-biased graphene base (e.g. active region) of device 300.

A tunnel barrier 320 (see FIG. 3B and FIG. 3C), which may comprise a thin dielectric barrier or vacuum (e.g. van der Waals gap), separates the graphene layer 330 from the highly doped substrate 310 (see FIG. 3C) in the active regions defined in FIG. 3B in which nearby devices 300 are isolated by a much thicker field oxide 390 such as $SiO_2$ (see FIG. 3C). Graphene layer 330 is contacted directly by two electrodes, analogous to the source and drain of a conventional field-effect transistor (see FIG. 3B and FIG. 3C). A thicker gate dielectric 340 separates the active area of the device (e.g. graphene) from a top-gate electrode 350. Bias voltages can be applied to the device through four electrodes: the source, drain, and top-gate electrodes, and a back-gate electrode that is in Ohmic contact with substrate material 310.

An electrostatic potential is applied across top-gate electrode 350, the top-gate dielectric material 340, and graphene 330 in order to induce a Fermi level shift with respect to the graphene Dirac point, which moves the graphene Fermi level deep into the valence band of the graphene. The top-gate material 350 could be an ultrathin semi-transparent metal layer/stack (e.g. 1 nm Ti/5 nm Pt), a large area (e.g. CVD grown and transferred) graphene layer, or a thicker transparent conducting oxide such as indium tin oxide (ITO). In another embodiment, such as the use of ionic liquid as the dielectric 340, the top-gate electrode 350 could simply be replaced with a probe. Then, a non-equilibrium or "hot" carrier distribution of electrons is injected via quantum tunneling through an ultra-thin tunnel barrier 320, which may include but is not limited to $SiO_2$, hexagonal boron nitride, MgO, $Gd_2O_3$, bilayer tunnel barriers, etc., into the conduction band of graphene 330. This is accomplished by applying a separate electrostatic potential across the underlying substrate 310 (e.g. the source of the hot electrons in this embodiment), the tunnel barrier 320, and the graphene 330.

Figures 5A, 5B, 5C:
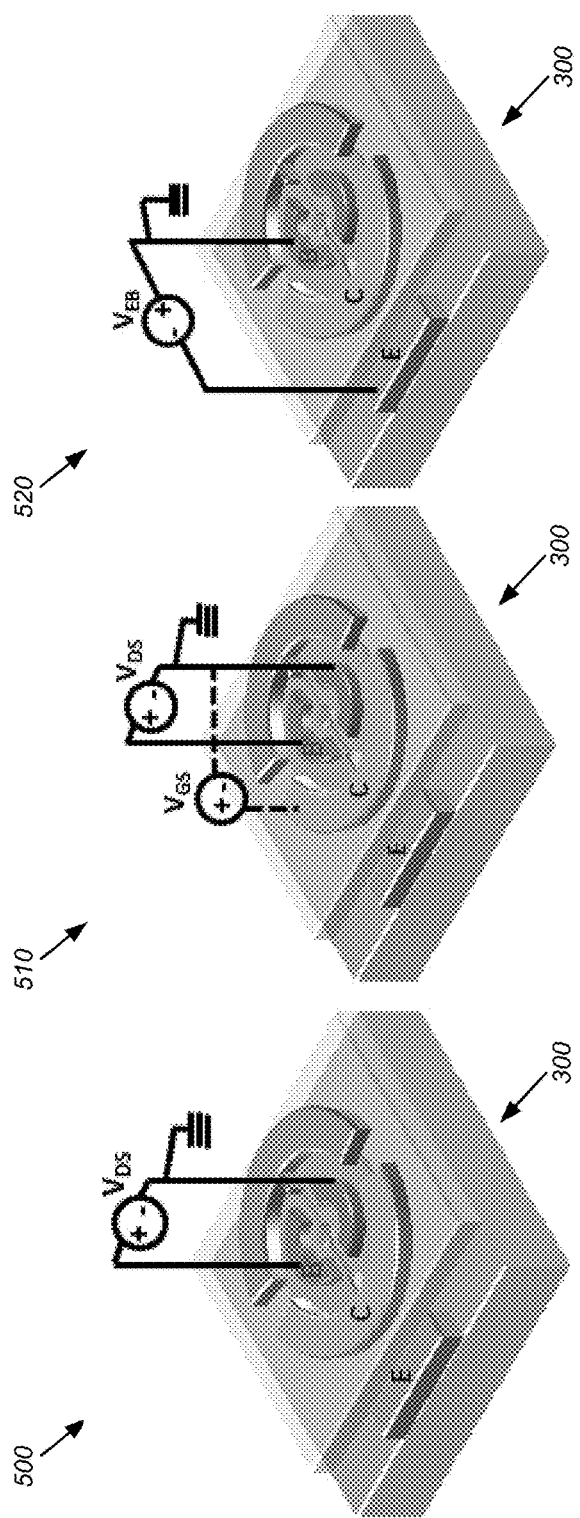
FIG. 5A shows a diagram illustrating a voltage biasing schematic for measuring the resistance (output characteristics) of graphene using the device shown in FIG. 3A.
FIG. 5B shows a diagram illustrating a voltage biasing schematic for measuring the Dirac point (transfer characteristics) of graphene using the device shown in FIG. 3A.
FIG. 5C shows a diagram illustrating a voltage biasing schematic for measuring the tunneling current across the tunnel barrier (input characteristics) using the device shown in FIG. 3A.

Referring to FIGS. 5A-5C, FIG. 5A shows a diagram 500 illustrating a voltage biasing schematic to obtain the output characteristics for measuring the resistance of graphene using device 300, FIG. 5B shows a diagram 510 illustrating a voltage biasing schematic to obtain the transfer characteristics (e.g. top-gate modulation) for measuring the Dirac point of graphene using device 300, and FIG. 5C shows a diagram 520 illustrating a voltage biasing schematic to obtain the input characteristics for measuring the tunneling current across the tunnel barrier using device 300. As shown, $V_{DS}$ represents the drain-source voltage that is applied laterally along the graphene layer, $V_{GS}$ represents the gate-to-source voltage (or $V_1$ as shown in FIG. 4) which is essentially the top-gate voltage allowing to observe the position of the Dirac point in the top-gate modulation transfer characteristics, and $V_{EB}$ represents the emitter-base voltage or $V_2$ as shown in FIG. 4

Figure 6:
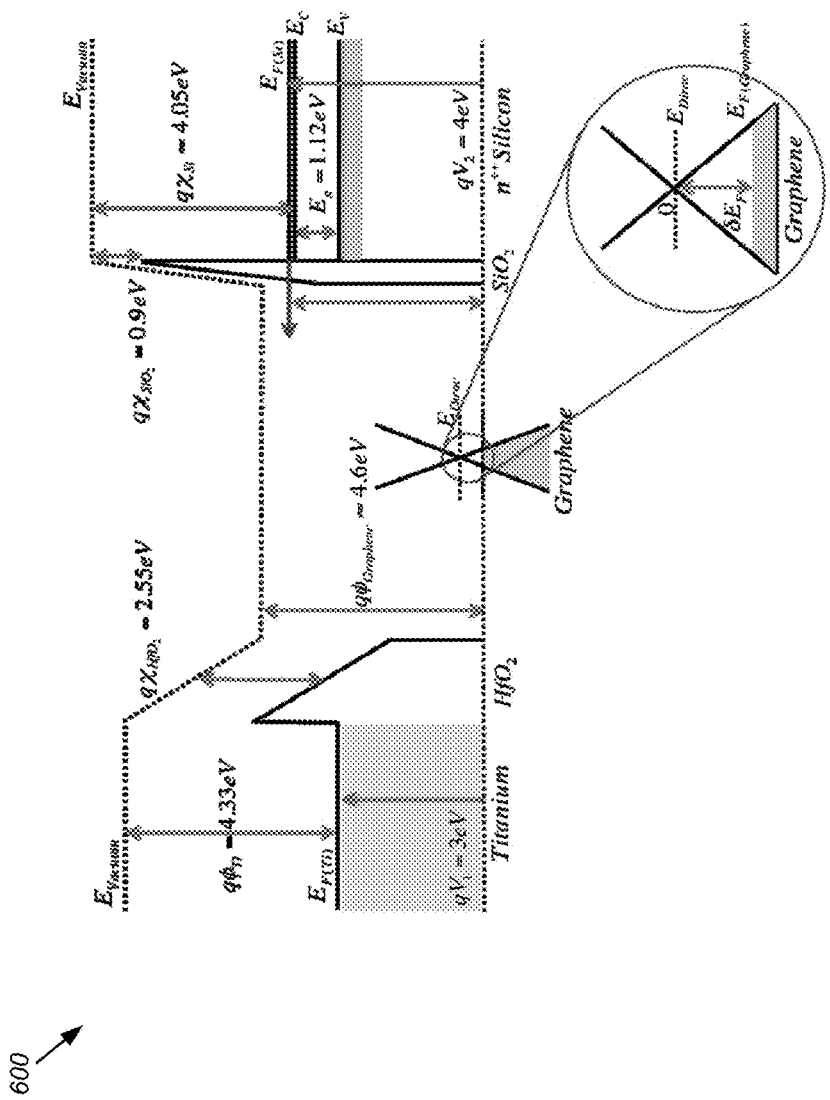
FIG. 6 shows an energy band diagram for the device shown in FIG. 3A with applied top-gate and back-gate voltage biases.

FIG. 6 shows an energy band diagram 600 for the device shown in FIG. 3A with applied top-gate and back-gate negative voltage biases. The band diagram shows a Fermi-level shift in graphene (e.g. $\delta E_F$ in the zoomed-in section) due to the influence of both electric fields across the top-gate and bottom-gate dielectrics in addition to graphene's quantum capacitance. The Fermi-level shift in graphene due to $V_1$ can be calculated from the equation:

$$V_1 = \frac{E_{FG}}{e} + \phi_1$$

with $$\frac{E_{FG}}{e} = \frac{\hbar |v_F| \sqrt{\pi |n|}}{e}$$

being determined by the quantum capacitance of graphene, where $E_{FG}$ is the graphene Fermi level, h is the reduced Planck constant, $v_F$ is the Fermi velocity of graphene, n is the carrier concentration in graphene;

$$\phi_1 = \frac{ne}{C_1}$$

being determined by the geometrical capacitance $$C_1 = \frac{\varepsilon_1 \varepsilon_0}{t_{ox_1}}$$

of the high-k top-gate dielectric (e.g. but not limited to $HfO_2$), where $\varepsilon_1$ is the top-gate dielectric constant and $t_{ox_1}$ is the thickness of the top-gate dielectric. A similar expression as above exists for the Fermi-level shift in graphene due to $V_2$. These two-coupled expressions will lead to the overall Fermi-level shift $\delta E_F$ in graphene shown in the zoomed-in section of FIG. 6. The red horizontal arrow indicates the input kinetic energy of the injected hot electrons from the underlying degenerately n-doped silicon substrate through the ultra-thin tunneling barrier in the active region of device 300 shown in FIG. 3B and FIG. 3C and into the graphene conduction band. It should be noted that the energy band diagram shown in FIG. 6 is for a particular embodiment of device 300 and that the materials listed can be altered in other embodiments of device 200 and device 300.

The following method may be used to calculate the expected luminescence power emanating from the properly biased embodiments of devices as disclosed herein. As an example, using a 3 nm $SiO_2$ tunneling oxide, the maximum tunneling current that may be safely injected without fatiguing or breaking the tunneling oxide with respect to a recently fabricated batch of devices 300 is about 500 nA (e.g. tunneling current densities up to $10^{-2}$ $Acm^{-2}$). As another example, an ultrathin 1.5 nm or thinner $SiO_2$ tunneling oxide may be used to achieve safe tunneling current densities up to 100 $Acm^{-2}$. Assuming a constant injection of a tunneling current of $I_{tunnel}$=500 nA into the graphene conduction band, and using the measured internal quantum efficiency of monolayer graphene as $10^{-6}$, about 3 million photons per second are determined to be emanating from the active area of a device (see FIG. 3C and FIG. 4). It should be noted that the calculation is for the peak photon energy corresponding to the onset of the HEL energy relaxation pathway ($\hbar\omega_{emit}=2|E_F|$) even though the emission is broadband. As an example, the active areas of our recently fabricated devices in accordance with the disclosed embodiments may vary from 100 μm to 250 μm. It is worth mentioning that the area of the active region can be reduced down even further (e.g. around 1 μm active region using conventional photolithography or sub-micron active region using e-beam lithography or similar patterning methods) to increase the tunneling current density.

$$I = \frac{n \cdot e}{t} \to n = \frac{I \cdot t}{e} = \frac{((500 \times 10^{-9} A) \cdot (1s))}{(1.602 \times 10^{-19} C)} = 3.1211 \times 10^{12} \frac{\text{electrons}}{\text{sec}}$$

$$\left(3.1211 \times 10^{12} \frac{\text{electrons}}{\text{sec}}\right) \cdot \left(10^{-6} \frac{\text{photons}}{\text{electron}}\right) = 3.1211 \times 10^{6} \frac{\text{photons}}{\text{sec}}$$

In some embodiments, the devices feature a ~55 nm thick $HfO_2$ top-gate dielectric with a measured average dielectric constant (ε) of ~17 and a corresponding capacitance of $C_{HfO2}=2.8\times10^{-7}$ $Fcm^{-2}$. Further, the graphene is unintentionally p-doped by its exposure to the ambient environment and features its Fermi level shifted by ~0.2 eV below its Dirac point (e.g. inside the valence band of graphene). The maximum electrostatic shift in the Fermi level of graphene into its valence band using $HfO_2$ in such a device embodiment with respect to a particular fabricated batch of devices is $|E_F|=0.5$ eV for an applied top-gate voltage of $V_{TG}=-10V$. Thus, the corresponding maximum energy of the emitted photon from graphene is $2|E_F|=2\cdot(0.5$ eV$)=1$ eV$=\hbar\omega_{emit}$ and this corresponds to a cutoff photon emission wavelength ($\lambda_{emit}$) of $E_{photon}$ (eV)$=\hbar\omega_{emit}=2|E_F|=1.24/\lambda$ (μm) $\to\lambda_{emit}=1.24/\hbar\omega_{emit}=1.24/1$ eV$=1.24$ μm when $V_{TG}=-10V$. The power corresponding to this peak photon emission is:

$$\left(3.1211 \times 10^{6} \frac{\text{photons}}{\text{sec}}\right) \cdot \left(\frac{1 \text{ eV}}{\text{photon}}\right) =$$
$$\left(3.1211 \times 10^{6} \frac{\text{eV}}{\text{sec}}\right) \cdot \left(1.602 \times 10^{-19} \frac{J}{\text{eV}}\right) = 5 \times 10^{-13} W = 500 \text{ } fW = 0.5 \text{ pW}$$

Using a biasing at $I_{tunnel}=500$ nA and $V_{TG}=-10V$, the peak of the broadband HEL spectrum ($\lambda_{emit}$) should have a power of 0.5 pW at a wavelength of 1.24 μm (e.g. in the near-infrared spectral range).

The following method may be used to calculate the expected cutoff photon emission wavelength ($\lambda_{emit}$) from a properly biased device for a particular top-gate voltage ($V_{TG}$). First, a determination is made as to the particular predetermined value of the top-gate voltage that will be applied to the device. Then, the corresponding Fermi level shift, $|E_F|$, (e.g. in eV) into the valence band of graphene due to this $V_{TG}$ will be solved. Afterwards, this value is multiplied by two to get the emitted photon energy:

$$2|E_F|=E_{emission}=h\Phi_{emit}$$

The Fermi-level shift in graphene due to $V_1$ can be calculated from the equation:

$$V_1 = \frac{E_{FG}}{e} + \varphi_1 \text{ with } \frac{E_{FG}}{e} = \frac{\hbar|v_F|\sqrt{\pi|n|}}{e}$$

being determined by the quantum capacitance of graphene, where $E_{FG}$ is the graphene Fermi level, $\hbar$ is the reduced Planck constant, $v_F$ is the Fermi velocity of graphene, n is the carrier concentration in graphene;

$$\phi_1 = \frac{ne}{C_1}$$

is the potential drop across the top-gate dielectric and is determined by the geometrical capacitance $$C_1 = \frac{\varepsilon_1 \varepsilon_0}{t_{ox_1}}$$

of the high-k top-gate dielectric in this embodiment (e.g. but not limited to $HfO_2$), where $\varepsilon_1$ is the top-gate dielectric constant, $\varepsilon_0$ is the permittivity of free space, and $t_{ox1}$ is the thickness of the top-gate dielectric. The electrostatically induced carrier density (n) in the valence band of graphene may be determined by inserting a particular top-gate voltage value and the experimentally measured material parameters corresponding to the particular batch of devices 300 into the above equation.

The maximum Fermi level shift ($|E_F|$) into the valence band of graphene (e.g. p-doping) due to the above conditions and the electrostatically induced charge carrier density (n) may then be determined. This is accomplished by inserting the calculated carrier density into the linear energy dispersion relation unique to monolayer graphene: $E_F=\hbar|v_F||k_F|=\hbar|v_F|\sqrt{\pi|n|}$. This yields a particular Fermi level shift, $|E_F|$, into the valence band of graphene. This value is then multiplied by two to get the expected maximum emitted photon energy, $2|E_F|=E_{emit}=\hbar\omega_{emit}$. Finally, this photon emission value is inserted into the following relation: $E_{emit}=\hbar\omega_{emit}=2|E_F|$ (eV)$=1.24/\lambda_{emit\ (\mu m)}$ to arrive at the cutoff (e.g. peak) photon emission wavelength of the broadband HEL spectrum emanating from the active region of the biased device (see FIG. 3A-FIG. 3C).

Figure 7:
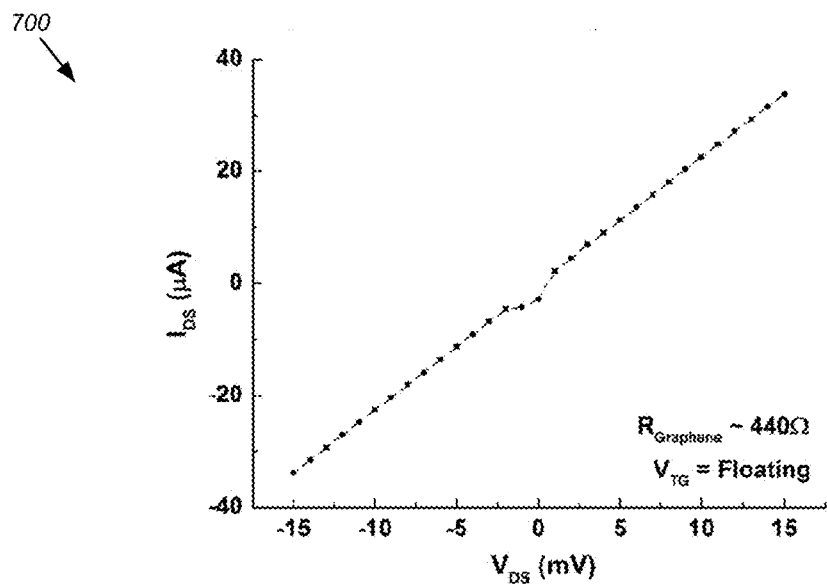
FIG. 7 shows a graph illustrating the output characteristics for chemical vapor deposited (CVD) graphene layer used in devices in accordance with the disclosed embodiments.

FIG. 7 shows a graph 700 illustrating the output characteristics for chemical vapor deposition (CVD) graphene layer used in devices in accordance with the disclosed embodiments. The results shown are based upon a device biased as shown in FIG. 5A. The top-gate electrode is left floating. This particular device features a CVD graphene with a resistance of ~440Ω and an area of around $8\times10^{-4}$ $cm^2$. The graphene resistance could change from batch to batch, depending upon the particular growth and transfer process used as well as any residues and contamination introduced throughout the fabrication process flow. An Ohmic contact is evident from the current-voltage characteristics. The drain and source contacts on top of the CVD graphene are Cr (20 nm)/Au (100 nm) for this particular embodiment and fabricated batch of devices.

Figure 8:
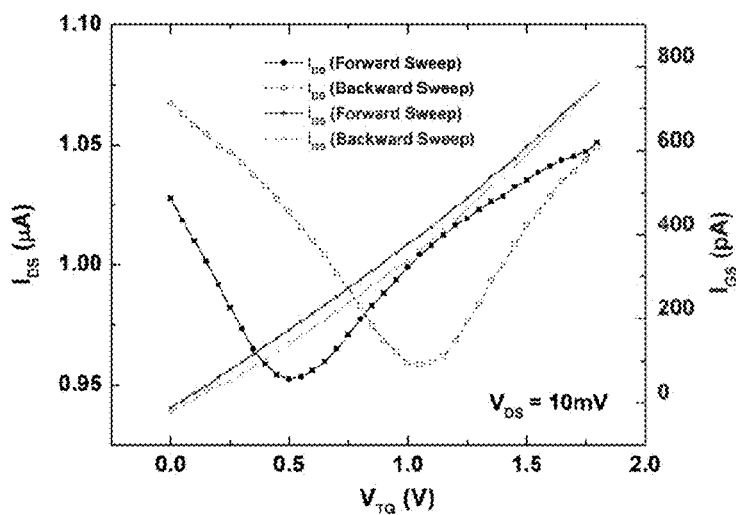
FIG. 8 shows a graph illustrating top-gate modulation transfer characteristics for a graphene-based device in accordance with the disclosed embodiments.

FIG. 8 shows a graph 800 illustrating top-gate modulation transfer characteristics for a graphene-based device in accordance with the disclosed embodiments. The results shown are based upon a device biased as shown in FIG. 5B. The characteristics shown are used to help determine the actual Dirac point of graphene. A constant drain-source bias of $V_{DS}=+10$ mV is applied across the graphene in order to generate a constant drain current across the graphene. Then, we sweep the top-gate voltage ($V_{TG}$) from 0 to +1.75V and back while simultaneously measuring the drain current ($I_{DS}$) across the graphene layer and the leakage current ($I_{GS}$) across the HfO$_2$ top-gate dielectric. Both the forward and the backward sweeps are included to show the typical hysteresis due to the HfO$_2$ top-gate dielectric. The ambipolar transport behavior of graphene is observed with the hole branch to the left ($V_{TG}$<+0.5V) and the electron branch to the right ($V_{TG}$>+0.5V) of the Dirac point voltage.

More importantly, the Dirac point voltage ($V_{TG}=V_{Dirac}$) is equal to $V_{TG}=+0.5V$ during the forward sweep, which indicates that the CVD graphene is unintentionally p-doped due to its exposure to the ambient environment (e.g. air and water). The leakage current through the HfO$_2$ top-gate dielectric is shown on the right axis of the graph 800 and is less than $I_{GS}=800$ pA for $V_{TG}=+1.75V$. Note that we first perform a top-gate modulation to experimentally determine the initial condition of the Fermi level shift in the valence band of the graphene with respect to its Dirac point. Knowing this initial condition (e.g. unintentional doping of graphene), we can then include it in the equation for calculating V1 as:

$$V_1 - V_{InitialDiracPoint} = \frac{E_{FG}}{e} + \varphi_1,$$

where $V_{InitialDiracPoint}$ is the initial actual doping in graphene as opposed to the theoretical value of $V_{Dirac}=0V$).

Figure 9:
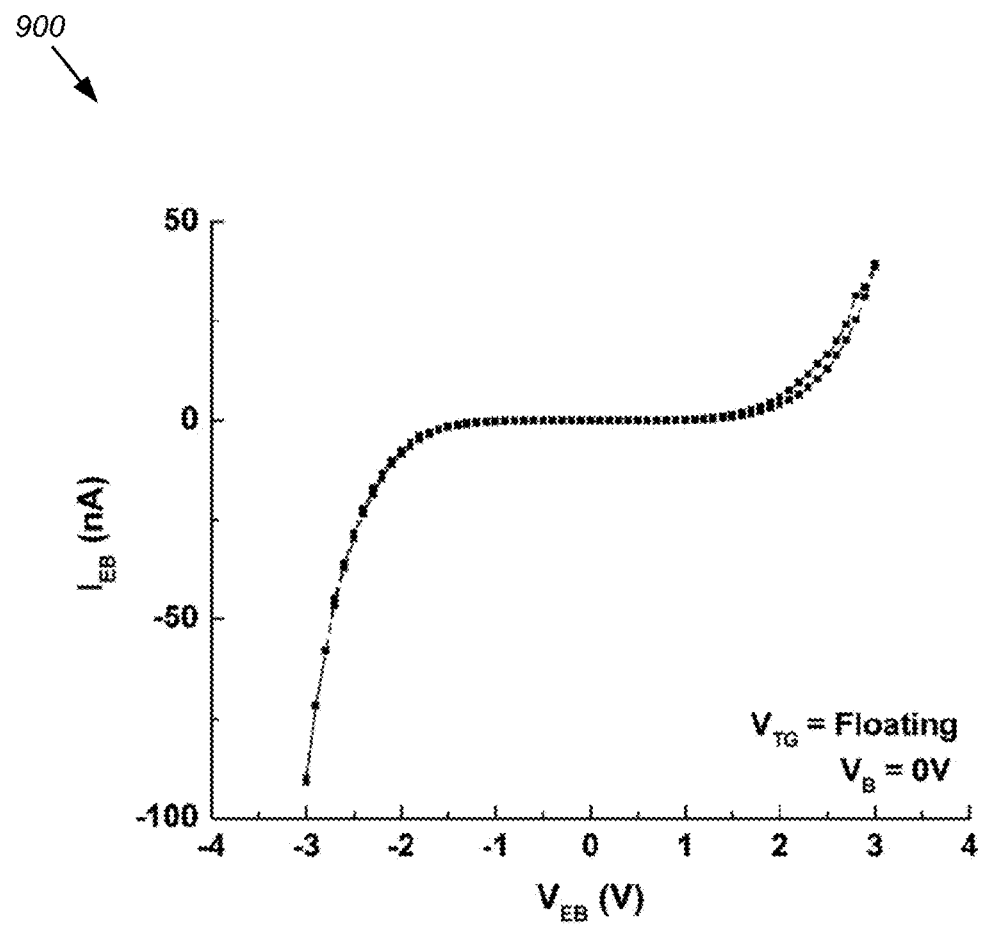
FIG. 9 shows a graph illustrating tunnel barrier input characteristics for a graphene-based device in accordance with the disclosed embodiments.

FIG. 9 shows a graph 900 illustrating tunnel oxide input characteristics for a graphene-based device in accordance with the disclosed embodiments. The device is biased as shown in FIG. 5C. The device's base contacts (e.g., the source and drain contacts) are grounded. The top-gate voltage is left floating during the measurements. The hot electron injection current through the ~3 nm thick SiO$_2$ tunnel oxide to graphene's conduction band is about $I_{EB}=-90$ nA at $V_{EB}=-3V$. A maximum tunneling (e.g. from graphene's conduction band into the silicon) current of $I_{EB}$~+40 nA occurs at $V_{EB}=+3V$. Note that the conduction band offset (CBO) between SiO$_2$ and graphene is calculated to be $\Delta e=3.7$ eV, whereas the CBO between silicon and SiO$_2$ is $\Delta e=3.15$ eV. Thus, the asymmetry in the $I_{EB}$-$V_{EB}$ characteristics is attributed to the different barrier heights on either side of the SiO$_2$ tunnel oxide. Data from both the forward and the backward sweeps are shown and displays a negligible hysteresis due to the SiO$_2$ tunnel oxide. The hot electron injection area for this particular device is about $6\times10^{-5}$ cm$^2$.

Figure 10:
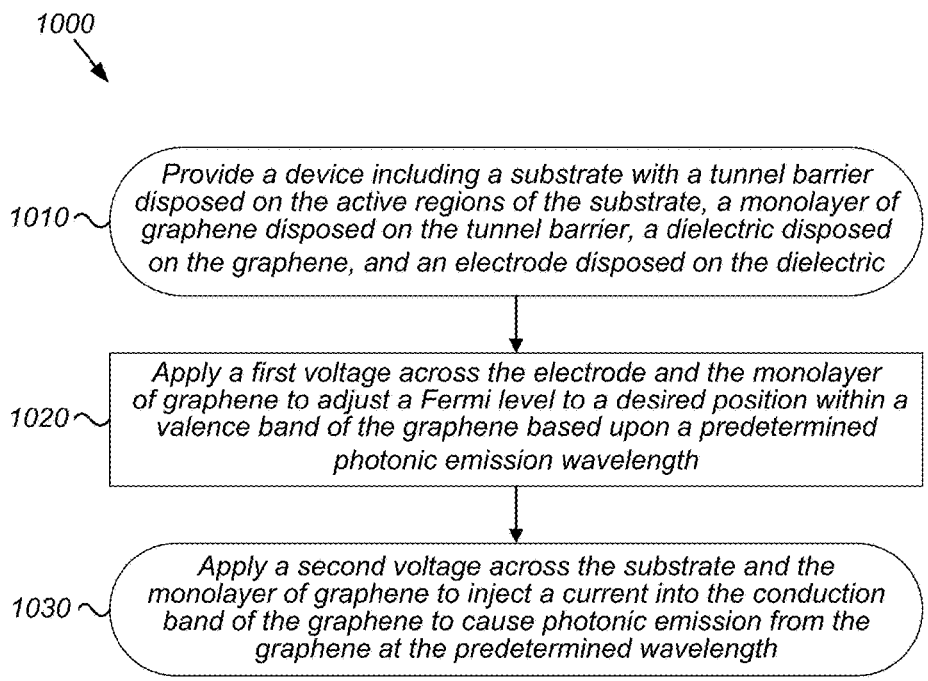
FIG. 10 shows a flowchart of an embodiment of a method in accordance with the disclosed embodiments.

FIG. 10 shows a flowchart of an embodiment of a method 1000 in accordance with the disclosed embodiments. Some or all of the steps of method 1000 may be performed by a device such as device 200 shown in FIG. 2 or device 300 shown in FIGS. 3A-3C. As such, reference may be made to any of the devices/methods shown in such figures when discussing the embodiment of the method 1000 shown in FIG. 10. Further, while FIG. 10 shows one embodiment of method 1000 including steps 1010-1030, other embodiments of method 1000 may contain fewer steps or more steps. Further, while in some embodiments the steps of method 1000 may be performed as shown in FIG. 10, in other embodiments the steps may be performed in a different order, or certain steps may occur simultaneously with one or more other steps.

Method 1000 begins with step 1010, which involves providing a device 300 comprising a substrate 310 having a tunnel barrier 320 disposed on an active region of the substrate 310 as shown in FIG. 3B and FIG. 3C and a monolayer of graphene 330 disposed on the tunnel barrier 320, a dielectric material 340 disposed over the graphene 330, and an electrode 350 disposed over the dielectric material 340. Step 1020 involves applying a first voltage $V_1$ across the electrode 350 and the monolayer of graphene 330, to adjust a Fermi level within the monolayer of graphene 330 to a predetermined Fermi level position within a valence band of the monolayer of graphene 330 based upon a predetermined emission wavelength ($\lambda_{emit}$).

As used herein, a "predetermined emission wavelength ($\lambda_{emit}$)" or "predetermined emission wavelength" or "onset wavelength ($\lambda_{emit}$)" refers to the wavelength at the peak of the broadband HEL spectrum (e.g. onset wavelength at which HEL energy relaxation pathway becomes possible) that is to be emitted from the active region of the graphene in the device. It is the main parameter from which to achieve the proper voltage biasing to induce light emission at this wavelength. By using the actually measured device material parameters, $$V_1 = \frac{E_{FG}}{e} + \varphi_1$$

will determine the voltage bias necessary to emit a broadband HEL spectrum peaked at this wavelength ($\lambda_{emit}$). In some embodiments, the predetermined emission wavelength is a particular wavelength range. In some embodiments, the predetermined emission wavelength is a range that could be voltage-tuned between about 700 nm and about 1 mm. In some embodiments, the predetermined emission wavelength is a range that could be voltage-tuned between about 390 nm and about 700 nm. In some embodiments, the predetermined emission wavelength is a range that could be voltage-tuned between about 270 nm and about 390 nm.

Step 1030 involves injecting a current into a conduction band of the monolayer of graphene 330 to cause the monolayer of graphene 330 to emit photons at the predetermined emission wavelength. While in some embodiments the current injection may occur via tunneling between the substrate 310, tunnel barrier 320, and the graphene 330, in other embodiments the current injection may occur thermionically, such as a Schottky junction for the emitter.

Some or all of the steps of method 1000 may be stored on a non-transitory computer readable storage medium, wherein the steps are represented by computer readable programming code. The steps of method 1000 may also be computer-implemented using a programmable device, such as a computer-based system. Method 1000 may comprise instructions that, when loaded into a computer-based system, cause the system to execute the steps of method 1000. Method 1000 may be implemented using various programming languages, such as "Java", "C", "C++", or "MATLAB", etc.

Various storage media, such as magnetic computer disks, optical disks, and electronic memories, as well as computer readable media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself, and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

Figure 11:
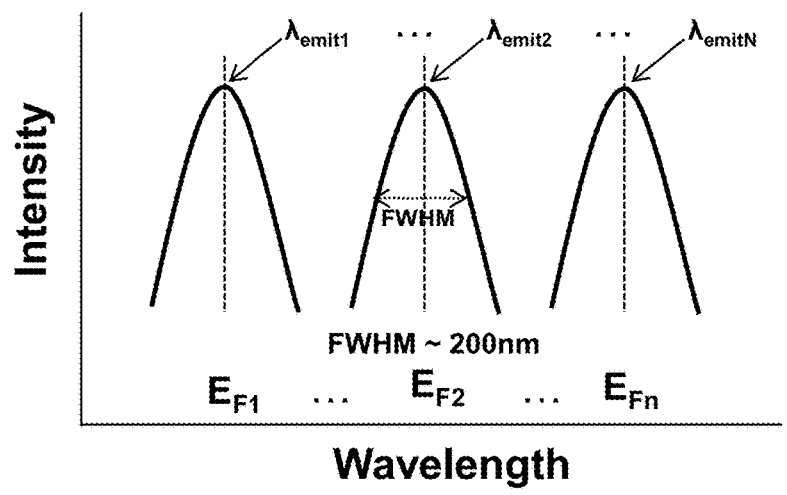
FIG. 11 shows a graph illustrating the concept of a voltage-tunable wavelength-agile injection electroluminescence device in accordance with the disclosed embodiments.

FIG. 11 shows a graph 1100 illustrating the concept of a voltage-tunable wavelength-agile injection electroluminescence device in accordance with the disclosed embodiments. The voltage-tunable wavelength agility is solely enabled by monolayer graphene's unique linear energy dispersion relation. The full-width at half-maximum (FWHM) of the broadband HEL spectrum is around 200 nm and it is peaked at the onset wavelength ($\lambda_{emit}$) at which the HEL energy relaxation pathway becomes viable. This onset wavelength ($\lambda_{emit}$) of photon emission may theoretically be voltage-tunable continuously from the ultraviolet (UV) to the terahertz (THz) regime of the electromagnetic spectrum. The graph 1100 shows three representative Fermi level shift values (see FIG. 1 for the diagram) into the valence band of the monolayer graphene which is achieved by three different voltage biases in order to show the wavelength agility aspect of this disclosed embodiment.

The language used in the specification has been principally selected for readability and instructional purposes, and may not have been selected to delineate or circumscribe the inventive subject matter. Accordingly, the disclosure of the inventive subject matter is intended to be illustrative, but not limiting, of the scope of the invention, which is set forth in the following claims.

Further, many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A method comprising the steps of:
    providing a device comprising a substrate having a tunnel barrier disposed on an active region defined on the substrate, a monolayer of graphene disposed on the tunnel barrier, a dielectric material disposed on the monolayer of graphene, and an electrode disposed on the dielectric material;
    applying a first voltage across the electrode and the monolayer of graphene to adjust a Fermi level within the monolayer of graphene to a Fermi level position within a valence band of the monolayer of graphene based upon a predetermined photonic emission wavelength; and
    applying a second voltage across the substrate and the monolayer of graphene to inject a current into a conduction band of the monolayer of graphene to cause the monolayer of graphene to emit photons at the predetermined emission wavelength.

2. The method of claim 1, wherein the predetermined emission wavelength is between about 700 nm and about 1 mm.

3. The method of claim 1, wherein the predetermined emission wavelength is between about 390 nm and about 700 nm.

4. The method of claim 1, wherein the predetermined emission wavelength is between about 270 nm and about 390 nm.

5. The method of claim 1, wherein the substrate comprises one of a metal, a semi-metal, and a semiconductor.

6. The method of claim 1, wherein the substrate comprises a compound semiconductor selected from one of elemental groups II-VI, III-V and IV.

7. The method of claim 1, wherein the substrate comprises degenerately-doped n-type silicon.

8. The method of claim 1, wherein the dielectric material comprises a dielectric having a k-value greater than about 3.8.

9. The method of claim 1, wherein the dielectric material comprises hexagonal boron nitride.

10. The method of claim 1, wherein the dielectric material comprises one of an ion-gel, an ionic liquid, and a gel polymer electrolyte.

11. The method of claim 1, wherein the tunnel barrier comprises one of MgO, $SiO_2$, monolayer hexagonal boron nitride, multilayer hexagonal boron nitride, and $Gd_2O_3$.

12. The method of claim 1, wherein the current is electrically-induced.

13. The method of claim 1, wherein the current is photo-induced.

14. A device comprising:
    a substrate;
    a tunnel barrier disposed on an active region defined on the substrate;
    at least one monolayer of graphene disposed on the tunnel barrier;
    a dielectric material disposed on the monolayer of graphene,
    an electrode disposed over a portion of the dielectric material;
    a first electrical contact disposed over a portion of the monolayer of graphene;
    a second electrical contact disposed over a portion of the dielectric material;
    a third electrical contact disposed over a portion of the substrate;
    a first voltage source connected between the first electrical contact and the second electrical contact, the first voltage source configured to apply a first voltage to adjust a Fermi level within the monolayer of graphene to a Fermi level position within a valence band of the monolayer of graphene based upon a predetermined emission wavelength; and
    a second voltage source connected between the first electrical contact and the third electrical contact, the second voltage source configured to apply a second voltage to inject a current into a conduction band of the monolayer of graphene to cause the monolayer of graphene to emit photons at the predetermined emission wavelength.

15. The device of claim 14, wherein the substrate comprises degenerately-doped n-type silicon and the at least one monolayer of graphene is p-doped.

16. The device of claim 14, wherein the at least one monolayer of graphene comprises more than two separate monolayers of graphene each featuring a band structure with linear energy dispersion relation near the Dirac (K/K') point.

17. The device of claim 16, wherein the two separate monolayers of graphene are separated by atomically-thin layered materials.

18. The device of claim 17, wherein the atomically-thin layered materials comprise one of hexagonal boron nitride and transition metal dichalcogenides.

19. The device of claim 14, wherein the dielectric material comprises one of $HfO_2$, $Al_2O_3$, $TiO_2$, monolayer hexagonal boron nitride, and multilayer hexagonal boron nitride.

20. The device of claim 14, wherein the dielectric material comprises one of an ion-gel, an ionic liquid, and a gel polymer electrolyte.

21. The device of claim 14, wherein the tunnel barrier comprises one of MgO, $SiO_2$, monolayer hexagonal boron nitride, multilayer hexagonal boron nitride, and $Gd_2O_3$.

22. The device of claim 14, wherein the photons are emitted with a broadband hot electron luminescence spectrum peaked at the predetermined photon emission wavelength.

23. The device of claim 14, wherein the current injected into the conduction band of the monolayer of graphene is modulated at frequencies of up to about 10 THz.

24. A device comprising:
   a substrate;
   a tunnel barrier disposed on an active region defined on the substrate;
   at least one monolayer of graphene disposed on the tunnel barrier;
   a dielectric material disposed on the monolayer of graphene,
   an optically-transparent electrode disposed over a portion of the dielectric material;
   a first electrical contact disposed over a portion of the monolayer of graphene lying outside of the active region defined on the substrate;
   a second electrical contact disposed over a portion of the dielectric material and electrically connected to the optically-transparent electrode in the active region defined on the substrate;
   a third electrical contact disposed over a portion of the substrate;
   a first voltage source connected between the first electrical contact and the second electrical contact, the first voltage source configured to apply a first voltage to adjust a Fermi level within the monolayer of graphene to a Fermi level position within a valence band of the monolayer of graphene based upon a predetermined emission wavelength; and
   a second voltage source connected between the first electrical contact and the third electrical contact, the second voltage source configured to apply a second voltage to inject a current into a conduction band of the monolayer of graphene to cause the monolayer of graphene to emit photons at the predetermined emission wavelength.

\* \* \* \* \*